US012803565B2

(12) United States Patent
Weil et al.

(10) Patent No.: US 12,803,565 B2
(45) Date of Patent: Nov. 17, 2026

(54) DIGITAL-TO-ANALOG CONVERTER (DAC) CLOCK SPUR REDUCTION FOR MULTIPLE-INPUT MULTIPLE-OUTPUT (MIMO) APPLICATIONS

(71) Applicant: QUALCOMM Incorporated, San Diego, CA (US)

(72) Inventors: Andrew Weil, San Diego, CA (US); Shahin Mehdizad Taleie, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 194 days.

(21) Appl. No.: 18/656,176

(22) Filed: May 6, 2024

(65) Prior Publication Data

US 2025/0343554 A1 Nov. 6, 2025

(51) Int. Cl.
*H03M 1/06* (2006.01)
*H04B 7/06* (2006.01)

(52) U.S. Cl.
CPC ........ *H03M 1/0604* (2013.01); *H04B 7/0602* (2013.01)

(58) Field of Classification Search
CPC ............. H03M 1/0604; H03M 1/0827; H03M 1/0863; H03M 1/66; H04B 7/0602
See application file for complete search history.

(56) References Cited

U.S. PATENT DOCUMENTS

| | | | | |
|---|---|---|---|---|
| 6,424,282 | B1 * | 7/2002 | Maenza | H03M 1/0836 341/118 |
| 7,977,996 | B1 * | 7/2011 | Kjosness | H03K 5/1565 708/313 |
| 9,685,969 | B1 * | 6/2017 | Garg | H03M 1/66 |
| 10,128,827 | B1 * | 11/2018 | Quek | H03K 5/135 |

(Continued)

FOREIGN PATENT DOCUMENTS

| | | | |
|---|---|---|---|
| CN | 107181491 | B | 10/2020 |
| GB | 2604334 | A | 9/2022 |

OTHER PUBLICATIONS

Co-pending U.S. Appl. No. 18/449,552, inventor Mehdizad Taleie; Shahin, filed Aug. 14, 2023.

(Continued)

*Primary Examiner* — David B Lugo
(74) *Attorney, Agent, or Firm* — Patterson + Sheridan, L.L.P.

(57) ABSTRACT

Certain aspects of the present disclosure provide techniques and apparatus for signal transmission. An example apparatus generally includes: a first transmission chain including a first clock generator and a first digital-to-analog converter (DAC), an output of the first clock generator being coupled to a clock input of the first DAC, wherein the first transmission chain further includes a first digital data path coupled to an input of the first DAC; a second transmission chain including a second clock generator and a second DAC, an output of the second clock generator being coupled to a clock input of the second DAC, wherein the second trans- (Continued)

mission chain further includes a second digital data path coupled to an input of the second DAC; and a controller configured to set a first data phase associated with the first digital data path based on a first clock phase associated with the first clock generator.

20 Claims, 7 Drawing Sheets

(56) References Cited

U.S. PATENT DOCUMENTS

| | | | | |
|---|---|---|---|---|
| 11,533,068 | B1 | 12/2022 | Sharma et al. | |
| 2022/0239304 | A1 * | 7/2022 | Gunasekaran | H03M 1/1033 |
| 2023/0261700 | A1 * | 8/2023 | Grynewicz | G06F 1/10<br>375/267 |
| 2023/0396295 | A1 * | 12/2023 | Ranish | H04B 7/0617 |

OTHER PUBLICATIONS

International Search Report and Written Opinion—PCT/US2025/023439—ISA/EPO—Aug. 6, 2025.

* cited by examiner

DIGITAL-TO-ANALOG CONVERTER (DAC) CLOCK SPUR REDUCTION FOR MULTIPLE-INPUT MULTIPLE-OUTPUT (MIMO) APPLICATIONS

TECHNICAL FIELD

Certain aspects of the present disclosure generally relate to electronic devices and, more particularly, to techniques and apparatus for attenuating spur power.

BACKGROUND

Various electronic circuits operate using a clock signal. The clock signal may be used to synchronize the operations of circuits in electronic systems. For example, the clock signals may be provided to digital-to-analog converters (DACs) of transmission chains. The clock signals of the transmission chains may be synchronized to facilitate synchronous operations that are used for beamforming via the chains.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure provide an apparatus for signal transmission. The apparatus generally includes: a first transmission chain including a first clock generator and a first digital-to-analog converter (DAC), an output of the first clock generator being coupled to a clock input of the first DAC, wherein the first transmission chain further includes a first digital data path coupled to an input of the first DAC; a second transmission chain including a second clock generator and a second DAC, an output of the second clock generator being coupled to a clock input of the second DAC, wherein the second transmission chain further includes a second digital data path coupled to an input of the second DAC; and a controller configured to set a first data phase associated with the first digital data path based on a first clock phase associated with the first clock generator.

Certain aspects of the present disclosure provide a method for signal transmission. The method generally includes: setting a first clock phase associated with a first clock generator of an apparatus, the apparatus including: a first transmission chain including the first clock generator and a first DAC, an output of the first clock generator being coupled to a clock input of the first DAC, wherein the first transmission chain further includes a first digital data path coupled to an input of the first DAC; and a second transmission chain including a second clock generator and a second DAC, an output of the second clock generator being coupled to a clock input of the second DAC, wherein the second transmission chain further includes a second digital data path coupled to an input of the second DAC. The method may also include setting a first data phase associated with the first digital data path based on the first clock phase associated with the first clock generator.

Certain aspects of the present disclosure provide a wireless device. The wireless device generally includes: at least one first antenna; a first transmission chain coupled to the at least one first antenna and including a first clock generator and a first DAC, an output of the first clock generator being coupled to a clock input of the first DAC, wherein the first transmission chain further includes a first digital data path coupled to an input of the first DAC; at least one second antenna; a second transmission chain coupled to the at least one second antenna and including a second clock generator and a second DAC, an output of the second clock generator being coupled to a clock input of the second DAC, wherein the second transmission chain further includes a second digital data path coupled to an input of the second DAC; and a controller configured to set a first data phase associated with the first digital data path based on a first clock phase associated with the first clock generator.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
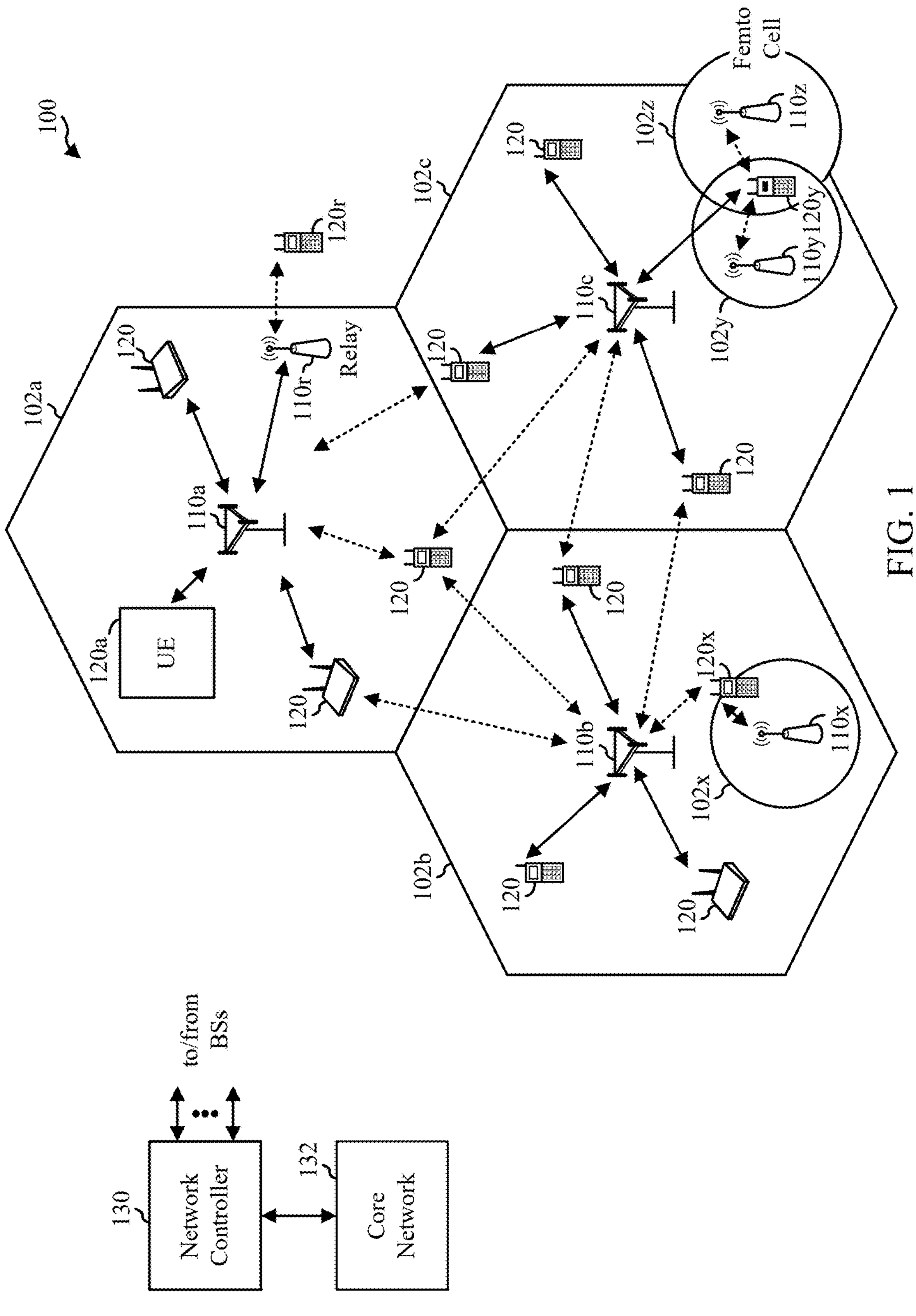
FIG. 1 is a diagram of an example wireless communications network, in which aspects of the present disclosure may be practiced.

Certain aspects of the present disclosure are directed toward techniques for reducing the cross-coupling of spurs between transmission chains. The transmission chains may be used for beamformed transmissions. The transmission chains may include digital-to-analog converters (DACs) operating based on clock signals. The clock signals generate spurs that cause noise (spurs) that electrically couple to other transmission chains. In some aspects, the phases of the clock signals may be set to reduce the cross-coupling of the spurs. The clock signal phases being set to reduce the cross-coupling of spurs may impact the output waveform of the transmission chains. Thus, to at least partially compensate for the impact on the output waveform, a controller may be used to adjust the phase of the clock and data paths for each transmission chain. In this manner, the phases of the clock signals may be set to reduce spurs without impacting the output waveforms of the transmission chains used for beam-forming.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipment's (UEs) 120*a-y* (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120*x*, 120*y*, etc.) may be dispersed throughout the wireless communications network 100, and each UE 120 may be stationary or mobile. The wireless communications network 100 may also include relay stations (e.g., relay station 110*r*), also referred to as relays or the like, that receive a transmission of data and/or other information from an upstream station (e.g., a BS 110*a* or a UE 120*r*) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set Nu of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Nu UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include multiple transmission chains including digital-to-analog converters (DACs), where phases of clock signals provided to the DACs are set to reduce cross-coupling of spurs between the transmission chains.

Figure 2:
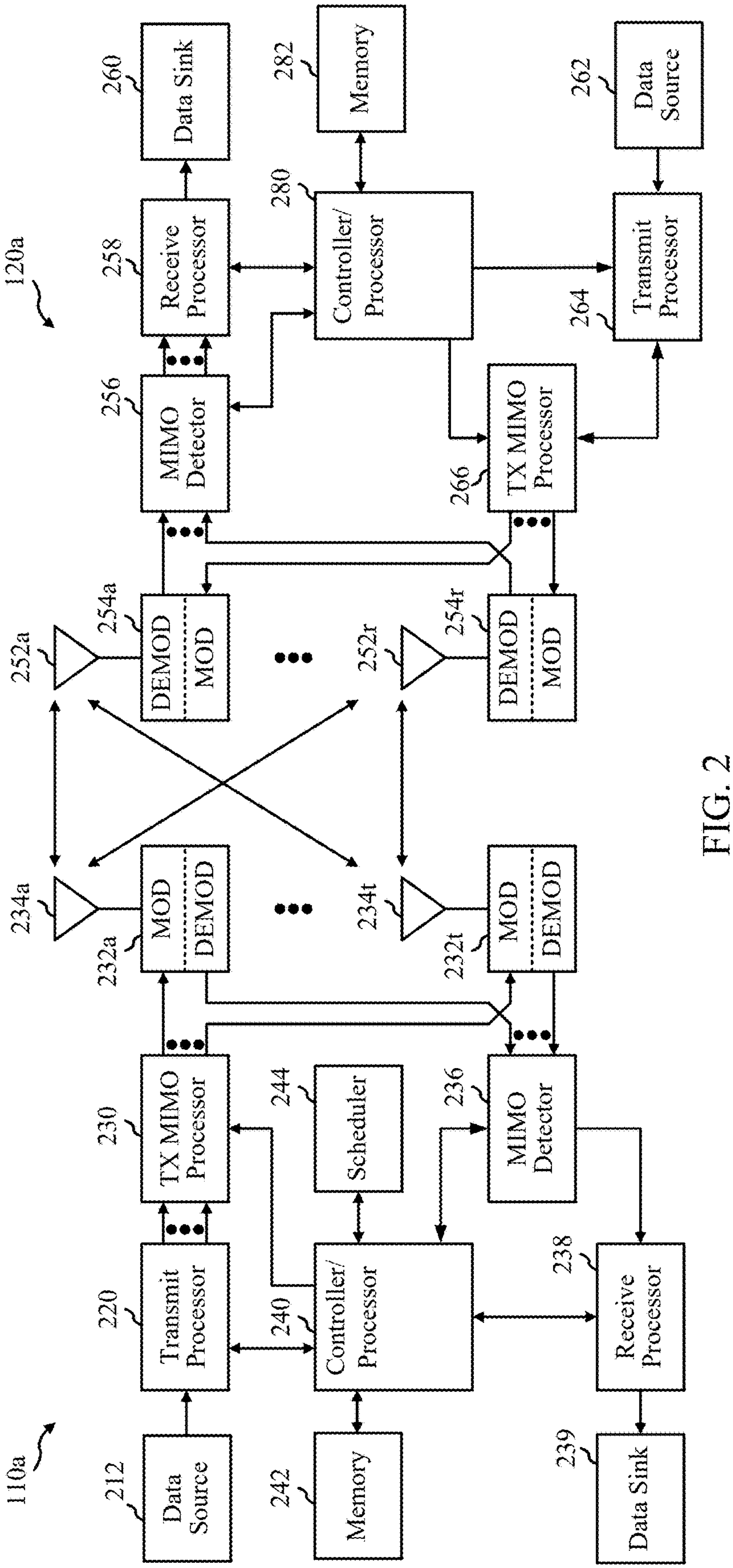
FIG. 2 is a block diagram conceptually illustrating a design of an example base station (BS) and user equipment (UE), in which aspects of the present disclosure may be practiced.

FIG. 2 illustrates example components of BS 110*a* and UE 120*a* (e.g., from the wireless communications network 100 of FIG. 1), in which aspects of the present disclosure may be implemented.

On the downlink, at the BS 110*a*, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARQ) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232*a*-232*t*. Each modulator in transceivers 232*a*-232*t* may process a respective output symbol stream (e.g., for orthogonal frequency division multiplexing (OFDM), etc.) to obtain an output sample stream. Each of the transceivers 232*a*-232*t* may further process (e.g., convert to analog, amplify, filter, and upconvert) the output sample stream to obtain a downlink signal. Downlink signals from the transceivers 232*a*-232*t* may be transmitted via the antennas 234*a*-234*t*, respectively.

At the UE 120*a*, the antennas 252*a*-252*r* may receive the downlink signals from the BS 110*a* and may provide received signals to the transceivers 254*a*-254*r*, respectively. The transceivers 254*a*-254*r* may condition (e.g., filter, amplify, downconvert, and digitize) a respective received signal to obtain input samples. Each demodulator (DEMOD) in the transceivers 232*a*-232*t* may further process the input samples (e.g., for OFDM, etc.) to obtain received symbols. A MIMO detector 256 may obtain received symbols from all the demodulators in transceivers 254*a*-254*r*, perform MIMO detection on the received symbols if applicable, and provide detected symbols. A receive processor 258 may process (e.g., demodulate, deinterleave, and decode) the detected symbols, provide decoded data for the UE 120*a* to a data sink 260, and provide decoded control information to a controller/processor 280.

On the uplink, at UE 120*a*, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254*a*-254*r* (e.g., for single-carrier frequency division multiplexing (SC-FDM), etc.), and transmitted to the BS 110*a*. At the BS 110*a*, the uplink signals from the UE 120*a* may be received by the antennas 234, processed by the demodulators in transceivers 232*a*-232*t*, detected by a MIMO detector 236 if applicable, and further processed by a receive processor 238 to obtain decoded data and control information sent by the UE 120*a*. The receive processor 238 may provide the decoded data to a data sink 239 and the decoded control information to the controller/processor 240.

The memories 242 and 282 may store data and program codes for BS 110*a* and UE 120*a*, respectively. The memories 242 and 282 may also interface with the controllers/processors 240 and 280, respectively. A scheduler 244 may schedule UEs for data transmission on the downlink and/or uplink.

In certain aspects of the present disclosure, the transceivers 232 and/or the transceivers 254 may include multiple transmission chains including DACs, where phases of clock signals provided to the DACs are set to reduce cross-coupling of spurs between the transmission chains.

NR may utilize orthogonal frequency division multiplexing (OFDM) with a cyclic prefix (CP) on the uplink and downlink. NR may support half-duplex operation using time division duplexing (TDD). OFDM and single-carrier frequency division multiplexing (SC-FDM) partition the system bandwidth into multiple orthogonal subcarriers, which are also commonly referred to as tones, bins, etc. Each subcarrier may be modulated with data. Modulation symbols may be sent in the frequency domain with OFDM and in the time domain with SC-FDM. The spacing between adjacent subcarriers may be fixed, and the total number of subcarriers may be dependent on the system bandwidth. The system bandwidth may also be partitioned into subbands. For example, a subband may cover multiple resource blocks (RBs).

Example RF Transceiver

Figure 3:
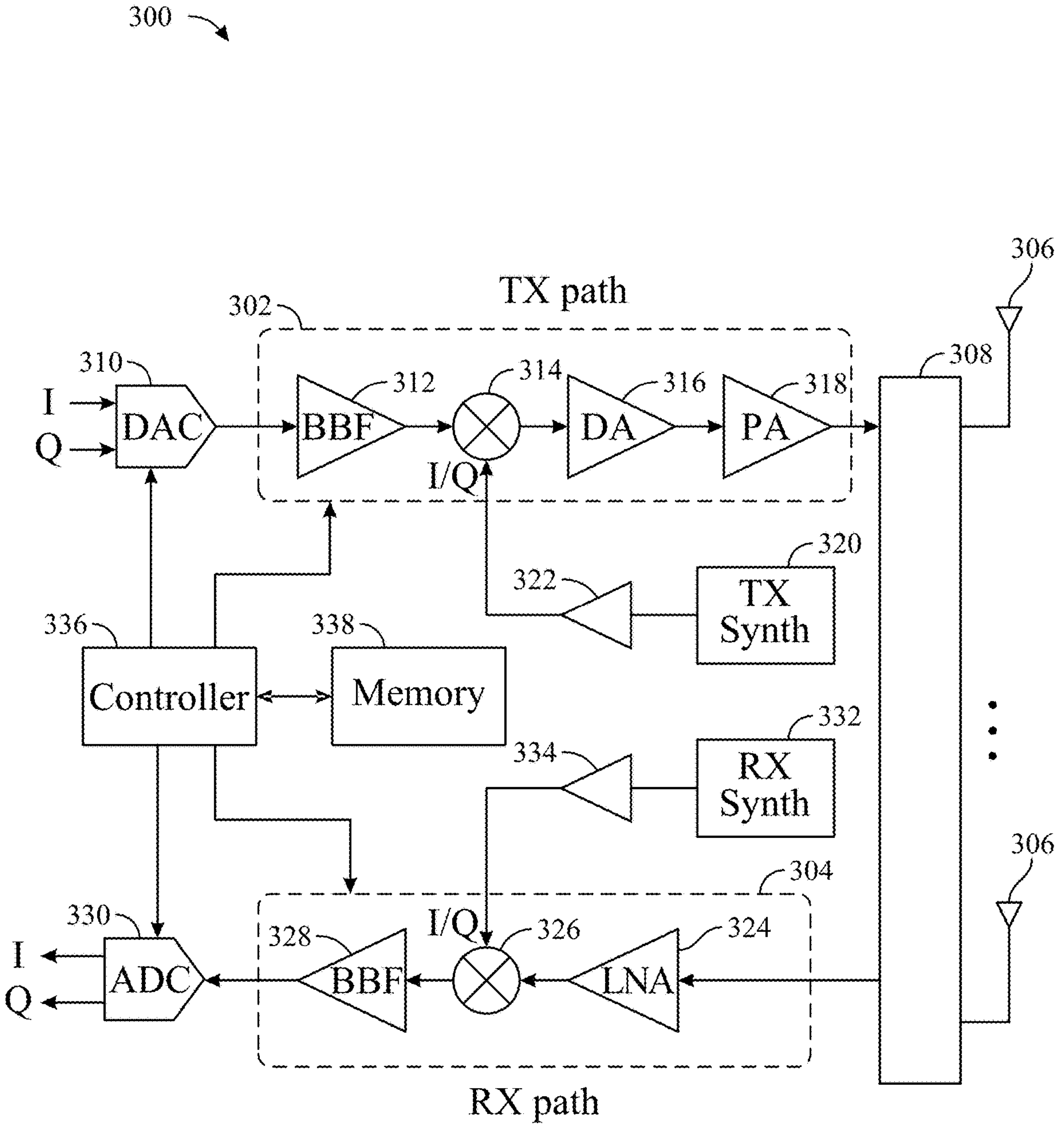
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission. In some aspects, the RF transceiver circuit 300 may include multiple transmission chains including DACs, where phases of clock signals provided to the DACs are set to reduce cross-coupling of spurs between the transmission chains.

The RX path 304 may include a low noise amplifier (LNA) 324, a mixer 326, and a baseband filter (BBF) 328. In some aspects, the LNA may be implemented with pre-biasing during a bypass mode. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320, which may be buffered or amplified by amplifier 322 before being mixed with the baseband signals in the mixer 314. Similarly, the receive LO may be produced by an RX frequency synthesizer 332, which may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency divider/multiplier that is driven by an oscillator (e.g., a VCO) in the frequency synthesizer.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for any of various other suitable systems.

Introduction to Clock Spurs

Harmonics of clock signals in mixed-signal, digital, and clock generation circuits create spurs on a supply node, a ground node, and on a substrate that would couple to sensitive parts of a system-on-chip (SOC). This issue is especially important in large-scale SOCs with multiple transmit and receive channels. Spur powers on different channels experience different transfer functions, adding up and causing hard-to-filter spurs coupling to transmit or receive sensitive ports. This issue is particularly of interest in infrastructures that have stringent emission spur specifications.

Figure 4:
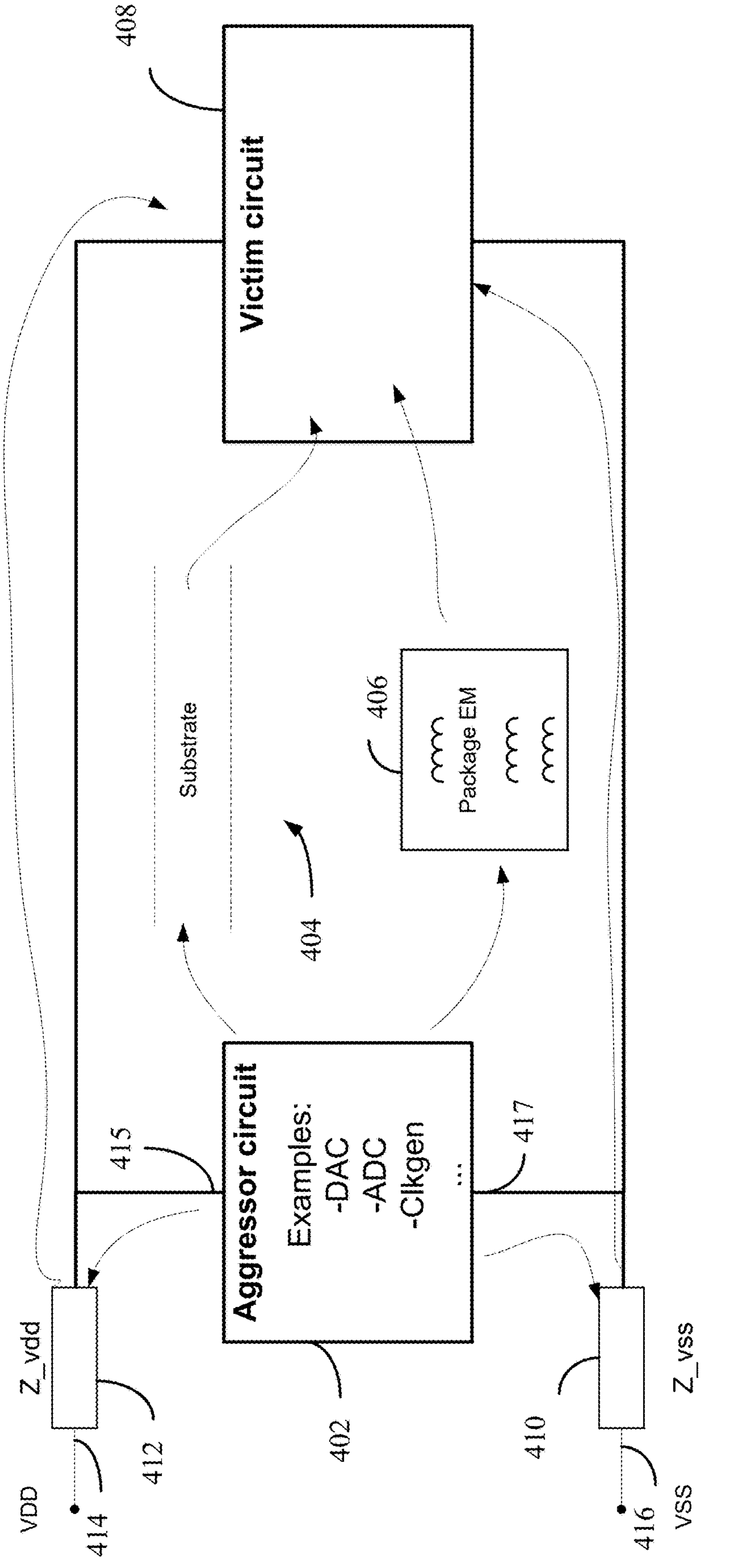
FIG. 4 illustrates an aggressor circuit coupling spur power to a victim circuit through various paths.

FIG. 4 illustrates an aggressor circuit 402 coupling spur power to a victim circuit 408 through various paths. As shown, the aggressor circuit 402 may be coupled to a supply node 414 receiving a supply voltage (VDD) and a reference potential node 416 (e.g., VSS, also referred to herein as a ground node). As shown, the supply node 414 may include a parasitic impedance 412 (e.g., labeled "Z_vdd"), and the reference potential node 416 may include a parasitic impedance 410 (e.g., labeled "Z_vss"). The parasitic impedance 412 may exist between a supply port 415 of the aggressor circuit 402 and the supply node 414, and the parasitic impedance 410 may exist between the reference potential port 417 (e.g., ground port) of the aggressor circuit 402 and the reference potential node 416.

Spur power from the aggressor circuit 402 may be coupled through the supply port 415, the reference potential port 417, a substrate 404, or package electromagnetic (EM) elements 406 (e.g., inductive elements) to a victim circuit 408. The aggressor circuit 402 may be circuitry such as a digital-to-analog converter (DAC), analog-to-digital converter (ADC), or any clock generation circuit. The victim circuit 408 may be a node of a transmitter or receiver in the baseband (BB) domain, intermediate frequency (IF) domain, or a radio frequency (RF) domain.

Example Techniques for Clock Spurs Reduction for Multi-Input Multiple-Output Applications Massive multiple-input multiple-output (MIMO) transmitters use several transmitter (TX) paths to generate beamformed signals. The TX paths should be synchronized to generate accurate beamformed output signals. The TX paths generate clock spurs that couple from one TX path to various on-chip victims. The phase of the coupled spurs varies depending on physical proximity and may manifest as either constructive or destructive interference based on relative distance. The coupling of the spurs may be difficult to simulate due to the size of the netlist, and thus, may be difficult to identify before chip fabrication.

Figure 5:
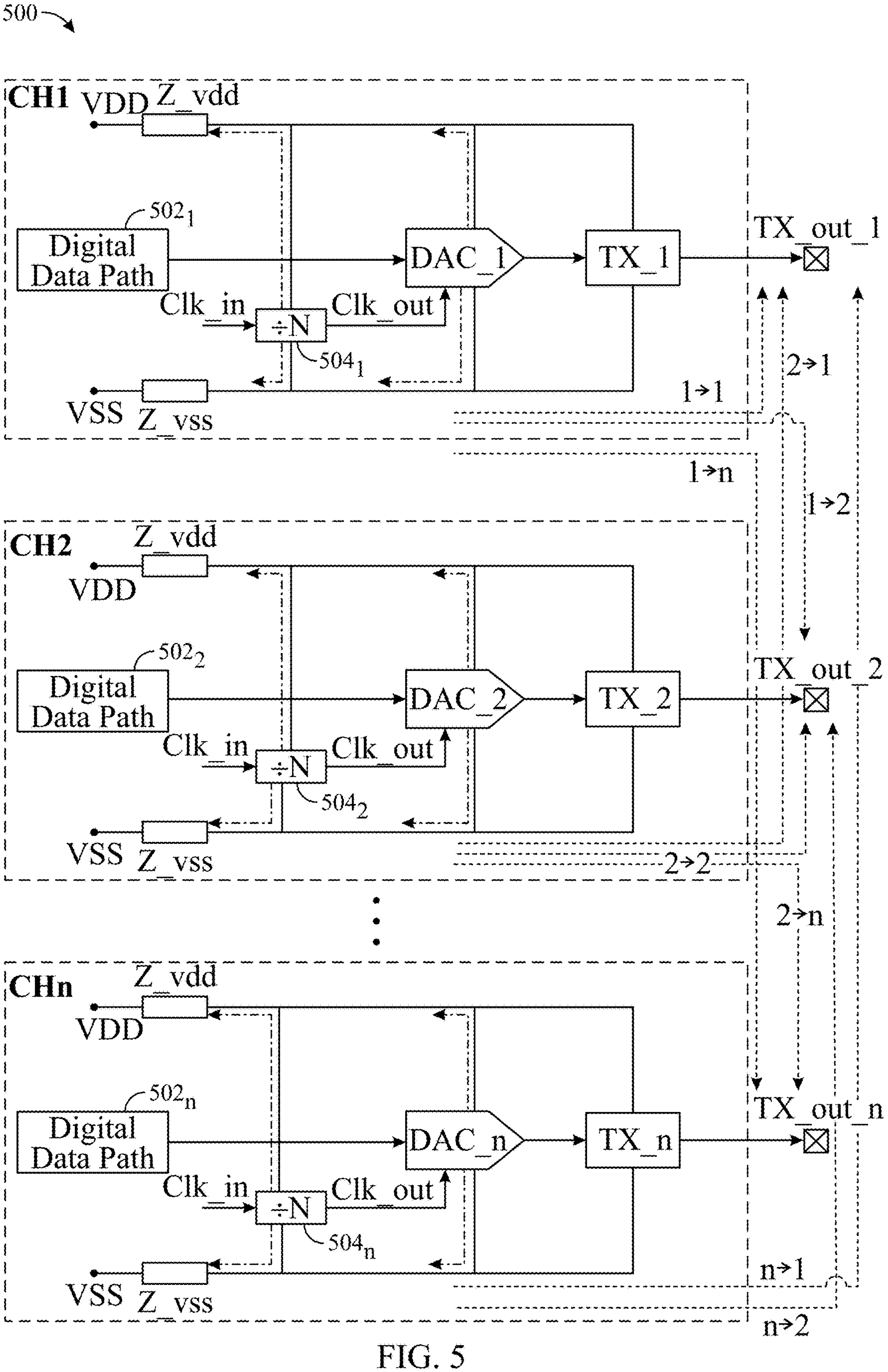

FIG. 5 illustrates a MIMO transmitter 500, in accordance with certain aspects of the present disclosure. As shown, the MIMO transmitter 500 may include multiple transmission chains (CH1 to CHn, n being a positive integer). Clock divider and clock buffers for a digital-to-analog converter (DAC) and transmitter front-end (TXFE) may generate clock frequency (Fclk) harmonics that couple from one transmission chain to another. For example, the transmission chains include respective clock dividers 5041 to 504*n*, each receiving an input clock (Clk_in) signal and generating a divided output clock (Clk_out) signal. The transmission chains may include digital-to-analog converters (DAC_1 to DAC_n), which may correspond to the DAC 310 of FIG. 3. The Clk_out signals may be provided to respective DACs (DAC_1 to DAC_n). Using the respective Clk_out signals, the DACs convert digital data received via respective digital data paths 5021 to 502*n* (collectively referred to herein as "digital data paths 502"), which are provided to respective transmitters (TX_1 to TX_n), generating respective TX output (TX_out_1 to TX_out_n) signals. The transmitters TX_1 to TX_n may correspond to the TX path 302 described with respect to FIG. 3. As shown, clock signal harmonics may couple from one chain to the same chain or to another chain, such as from chain 1 to chain 1, chain 1 to chain 2, chain 1 to chain n, chain 2 to chain 1, and so on. Certain aspects of the present disclosure provide digital-centric techniques for reducing cross-coupling of DAC clock spurs.

Figure 6:
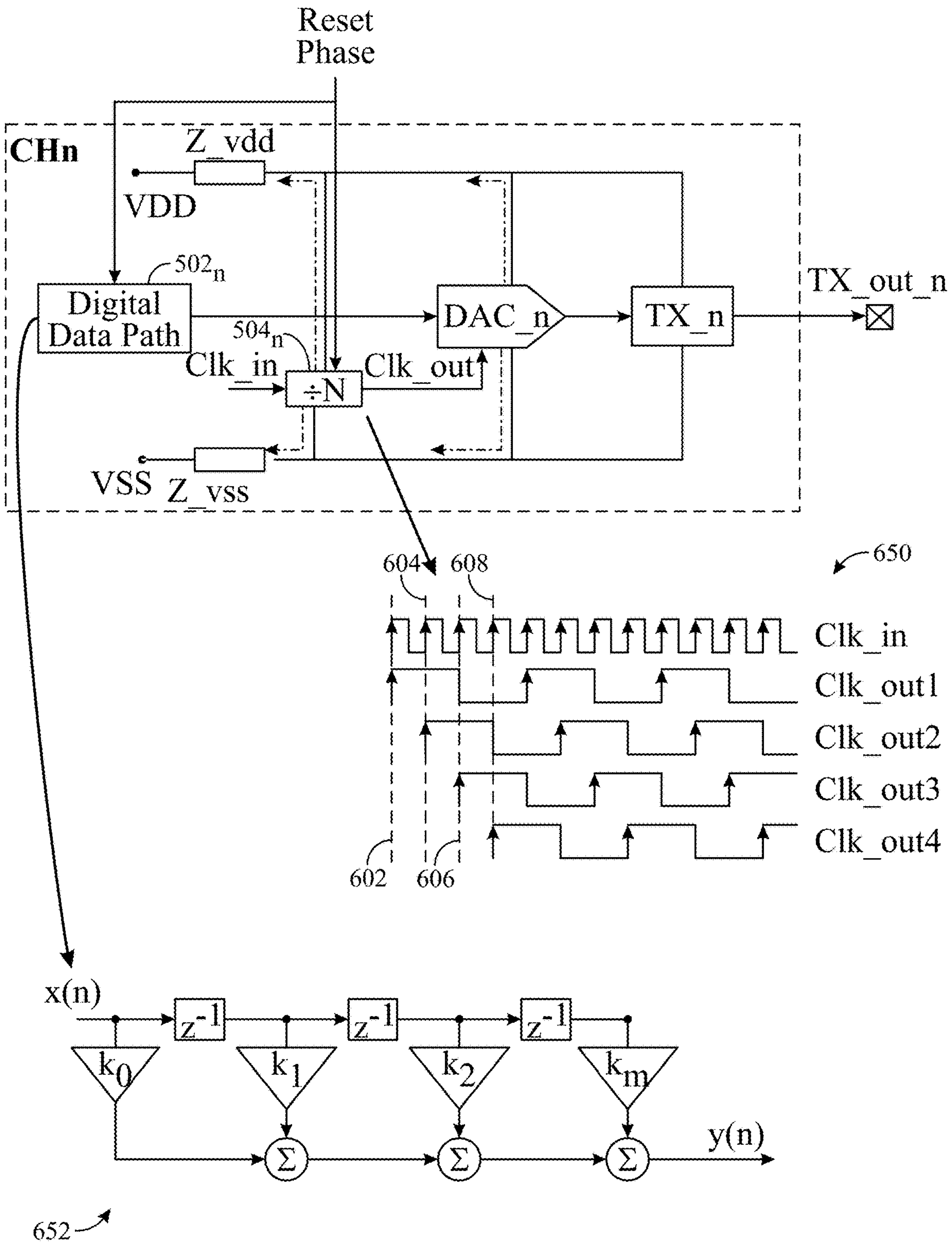
FIG. 6 illustrates techniques for adjusting a clock phase and a data phase to reduce clock spurs, in accordance with certain aspects of the present disclosure.

FIG. 6 illustrates techniques for adjusting a clock phase and a data phase to reduce cross-coupling of clock spurs, in accordance with certain aspects of the present disclosure. In some aspects, the transmission chains (CH1 to CHn) of the MIMO transmitter 500 may be provided separate reset phase signals, allowing an independently programmable clock divider reset for each DAC. In other words, using a separate clock divider reset state for each transmission chain allows for control of aggressor circuit phases (e.g., phase of DACs) to reduce the electrical coupling of spurs. After device fabrication, different phases for the clock dividers of the chains may be implemented to identify the phases for the clock dividers that provide the best performance across the chains (e.g., or at least provide a key performance indicator (KPI) such as error vector magnitude (EVM) or spectral emission mask (SEM) that is greater than a threshold for the chains).

As shown in timing diagram 650, the clock divider may receive a Clk_in signal and generate a Clk_out signal that may have one of multiple phases with respect to the Clk_in signal (e.g., the clock divider may generate one of Clk_out1, Clk_out2, Clk_out3, or Clk_out4 signals having different phases with respect to the Clk_in signal). The phase of the clock divider may selected by setting the reset phase of the clock divider. For instance, if the clock divider is reset at time 602, a first clock phase corresponding to Clk_out1 may be selected. If the clock divider is reset at time 604, a second clock phase corresponding to Clk_out2 may be selected. If the clock divider is reset at time 606, a third clock phase corresponding to Clk_out3 may be selected. If the clock divider is reset at time 608, a fourth clock phase corresponding to Clk_out4 may be selected. While four phases are shown, any suitable number of phases may be used.

Adjusting the phase associated with the clock divider without compensating for the adjustment may result in the output waveform of the chain being changed, adversely impacting the beamformed signal of the MIMO transmitter. Certain aspects use a fractional delay filter 652 in each of the digital data paths 502 to at least partially compensate for the corresponding clock divider phase adjustment. The fractional delay filter 652 may include digital delay elements ($z^{-1}$) and gain elements (e.g., with corresponding gain values $k_0$ to $k_m$, m being a positive integer) coupled between respective inputs of the delay elements and a corresponding summing element (Σ), as shown. The filter 652 may be implemented with any number of suitable taps. The filter 652 receive a data signal x(n) and generates a filtered data signal y(n), as shown. Based on the phase configured for the corresponding clock divider of the chain, the data path phase may be adjusted by selecting the appropriate gain values $k_0$ to $k_m$ for the gain elements of the associated filter. For instance, for CHn, depending on the phase of clock divider 504*n*, one or more gain values of the fractional delay filter of digital data path 502*n* may be selected to at least partially compensate for the clock divider phase adjustment.

The clock divider phase (e.g., the phase of the Clk_out signal) and the corresponding data path phase may be identified during a calibration phase after manufacturing the device. The clock divider phases and corresponding data path phases may be stored in a look-up table (LUT) to be used during mission mode.

The fractional delay filter may be used to correct the signal phase for beamforming with small area consumption. Certain aspects provide a software-based post-manufacture adjustment for spur reduction with a small area and power penalty. The present disclosure provides techniques for spur reduction in the digital domain, allowing for process scaling in the future. Post-device manufacture characterization and adjustment avoid die revisions for spur reduction.

Certain aspects provide a programmable digital group delay (e.g., delay of data) in conjunction with a phase-selectable clock divider to reduce the effect of spurs in MIMO transmitters and attenuate the clock spurs to levels below a single channel operation. Certain aspects provide separate clock divider reset states, as described. Each channel of multiple TX paths (chains) may vary (e.g., arbitrarily vary) the phase of an associated clock signal by choosing different phases for transmission path clock dividers while compensating (or at least adjusting) for the set phase of the clock signal to avoid (or at least reduce) constructive spur addition, as described herein.

Figure 7:
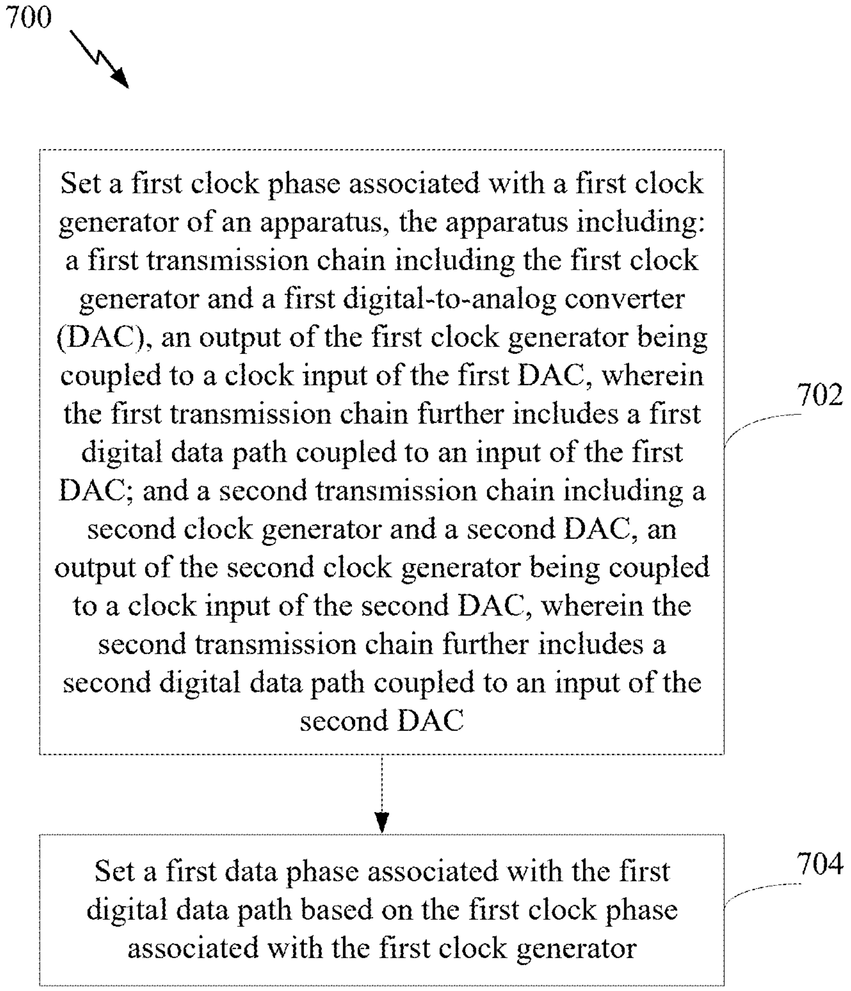
FIG. 7 is a flow diagram illustrating example operations for signal transmission, in accordance with certain aspects of the present disclosure.

FIG. 7 is a flow diagram illustrating example operations 700 for signal transmission, in accordance with certain aspects of the present disclosure. The operations 700 may be performed by a controller, such as the controller/processor 240 or 280 of FIG. 2.

At block 702, the controller sets a first clock phase associated with a first clock generator (e.g., clock divider 5041 of FIG. 5) of an apparatus. The apparatus generally includes a first transmission chain (e.g., CH1) including the first clock generator and a first DAC (e.g., DAC_1), an output of the first clock generator being coupled to a clock input of the first DAC. The first transmission chain may also include a first digital data path (e.g., digital data path 5021) coupled to an input of the first DAC. The apparatus may also include a second transmission chain (e.g., CH2) including a second clock generator (e.g., 5042) and a second DAC (e.g., DAC_2), an output of the second clock generator being coupled to a clock input of the second DAC. The second transmission chain may also include a second digital data path (e.g., digital data path 5022) coupled to an input of the second DAC.

At block 704, the controller sets a first data phase associated with the first digital data path based on the first clock phase associated with the first clock generator. The first clock phase may be set based on a LUT. The first clock phase may be set to reduce cross-coupling of spurs between first transmission chain and the second transmission chain.

Setting the first clock phase may include setting a phase of an output clock signal of the first clock generator with respect to an input clock signal of the first clock generator. Setting the phase of the output clock signal may include setting a reset phase of the clock generator.

In some aspects, the controller may also set a second clock phase associated with the second clock generator and set a second data phase associated with the second digital data path based on the second clock phase associated with the second clock generator. The first clock phase may be different from the second clock phase.

The first data path may include a fractional delay filter (e.g., fractional delay filter 652 of FIG. 6) configured to set the first data phase. The fractional delay filter comprises at least one digital gain element (e.g., gain elements $K_0$ to $k_m$). Setting the first data phase may include setting at least one gain value associated with the at least one digital gain element.

EXAMPLE ASPECTS

In addition to the various aspects described above, specific combinations of aspects are within the scope of the disclosure, some of which are detailed below:

Aspect 1: An apparatus for signal transmission, comprising: a first transmission chain including a first clock generator and a first digital-to-analog converter (DAC), an output of the first clock generator being coupled to a clock input of the first DAC, wherein the first transmission chain further includes a first digital data path coupled to an input of the first DAC; a second transmission chain including a second clock generator and a second DAC, an output of the second clock generator being coupled to a clock input of the second DAC, wherein the second transmission chain further includes a second digital data path coupled to an input of the second DAC; and a controller configured to set a first data phase associated with the first digital data path based on a first clock phase associated with the first clock generator.

Aspect 2: The apparatus of Aspect 1, wherein the controller is further configured to set the first clock phase based on a look-up table (LUT).

Aspect 3: The apparatus of Aspect 1 or 2, wherein the controller is further configured to set the first clock phase to reduce cross-coupling of spurs between the first transmission chain and the second transmission chain.

Aspect 4: The apparatus according to any of Aspects 1-3, wherein the first transmission chain and the second transmission chain are configured to perform beamformed transmissions.

Aspect 5: The apparatus according to any of Aspects 1-4, wherein: the first clock generator comprises a clock divider, the controller being further configured to set the first clock phase associated with the clock divider; and to set the first clock phase, the controller is configured to set a phase of an output clock signal of the clock divider with respect to an input clock signal of the clock divider.

Aspect 6: The apparatus of Aspect 5, wherein, to set the phase of the output clock signal, the controller is configured to set a reset phase of the clock divider.

Aspect 7: The apparatus according to any of Aspects 1-6, wherein the controller is further configured to set a second data phase associated with the second digital data path based on a second clock phase associated with the second clock generator.

Aspect 8: The apparatus of Aspect 7, wherein the first clock phase is different from the second clock phase.

Aspect 9: The apparatus according to any of Aspects 1-8, wherein the first digital data path comprises a fractional delay filter configured to set the first data phase.

Aspect 10: The apparatus of Aspect 9, wherein the fractional delay filter comprises at least one digital gain element and wherein, to set the first data phase, the fractional delay filter is configured to set at least one gain value associated with the at least one digital gain element.

Aspect 11: A method for signal transmission, comprising: setting a first clock phase associated with a first clock generator of an apparatus, the apparatus including: a first transmission chain including the first clock generator and a first digital-to-analog converter (DAC), an output of the first clock generator being coupled to a clock input of the first DAC, wherein the first transmission chain further includes a first digital data path coupled to an input of the first DAC; and a second transmission chain including a second clock generator and a second DAC, an output of the second clock generator being coupled to a clock input of the second DAC, wherein the second transmission chain further includes a second digital data path coupled to an input of the second DAC; and setting a first data phase associated with the first digital data path based on the first clock phase associated with the first clock generator.

Aspect 12: The method of Aspect 11, wherein the first clock phase is set based on a look-up table (LUT).

Aspect 13: The method of Aspect 11 or 12, wherein the first clock phase is set to reduce cross-coupling of spurs between the first transmission chain and the second transmission chain.

Aspect 14: The method according to any of Aspects 11-13, wherein the first clock generator comprises a clock divider, and wherein setting the first clock phase includes setting a phase of an output clock signal of the clock divider with respect to an input clock signal of the clock divider.

Aspect 15: The method of Aspect 14, wherein setting the phase of the output clock signal includes setting a reset phase of the clock divider.

Aspect 16: The method according to any of Aspects 11-15, further comprising: setting a second clock phase associated with the second clock generator; and setting a second data phase associated with the second digital data path based on the second clock phase associated with the second clock generator.

Aspect 17: The method of Aspect 16, wherein the first clock phase is different from the second clock phase.

Aspect 18: The method according to any of Aspects 11-17, wherein the first digital data path comprises a fractional delay filter configured to set the first data phase.

Aspect 19: The method of Aspect 18, wherein the fractional delay filter comprises at least one digital gain element and wherein setting the first data phase comprises setting at least one gain value associated with the at least one digital gain element.

Aspect 20: A wireless device, comprising: at least one first antenna; a first transmission chain coupled to the at least one first antenna and including a first clock generator and a first digital-to-analog converter (DAC), an output of the first clock generator being coupled to a clock input of the first DAC, wherein the first transmission chain further includes a first digital data path coupled to an input of the first DAC; at least one second antenna; a second transmission chain coupled to the at least one second antenna and including a second clock generator and a second DAC, an output of the second clock generator being coupled to a clock input of the second DAC, wherein the second transmission chain further includes a second digital data path coupled to an input of the second DAC; and a controller configured to set a data phase associated with the first digital data path based on a clock phase associated with the first clock generator.

Additional Considerations

The various operations of methods described above may be performed by any suitable means capable of performing the corresponding functions. The means may include various hardware and/or software component(s) and/or module (s), including, but not limited to a circuit, an application-specific integrated circuit (ASIC), or a processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. An apparatus for signal transmission, comprising:

a first transmission chain including a first clock generator and a first digital-to-analog converter (DAC), an output of the first clock generator being coupled to a clock input of the first DAC, wherein the first transmission chain further includes a first digital data path coupled to an input of the first DAC;

a second transmission chain including a second clock generator and a second DAC, an output of the second clock generator being coupled to a clock input of the second DAC, wherein the second transmission chain further includes a second digital data path coupled to an input of the second DAC; and a controller configured to set a first data phase associated with the first digital data path based on a first clock phase associated with the first clock generator.

2. The apparatus of claim 1, wherein the controller is further configured to set the first clock phase based on a look-up table (LUT).

3. The apparatus of claim 1, wherein the controller is further configured to set the first clock phase to reduce cross-coupling of spurs between the first transmission chain and the second transmission chain.

4. The apparatus of claim 1, wherein the first transmission chain and the second transmission chain are configured to perform beamformed transmissions.

5. The apparatus of claim 1, wherein:

the first clock generator comprises a clock divider, the controller being further configured to set the first clock phase associated with the clock divider; and to set the first clock phase, the controller is configured to set a phase of an output clock signal of the clock divider with respect to an input clock signal of the clock divider.

6. The apparatus of claim 5, wherein, to set the phase of the output clock signal, the controller is configured to set a reset phase of the clock divider.

7. The apparatus of claim 1, wherein the controller is further configured to set a second data phase associated with the second digital data path based on a second clock phase associated with the second clock generator.

8. The apparatus of claim 7, wherein the first clock phase is different from the second clock phase.

9. The apparatus of claim 1, wherein the first digital data path comprises a fractional delay filter configured to set the first data phase.

10. The apparatus of claim 9, wherein the fractional delay filter comprises at least one digital gain element and wherein, to set the first data phase, the fractional delay filter is configured to set at least one gain value associated with the at least one digital gain element.

11. A method for signal transmission, comprising:

setting a first clock phase associated with a first clock generator of an apparatus, the apparatus including:

a first transmission chain including the first clock generator and a first digital-to-analog converter (DAC), an output of the first clock generator being coupled to a clock input of the first DAC, wherein the first transmission chain further includes a first digital data path coupled to an input of the first DAC; and a second transmission chain including a second clock generator and a second DAC, an output of the second clock generator being coupled to a clock input of the second DAC, wherein the second transmission chain further includes a second digital data path coupled to an input of the second DAC; and setting a first data phase associated with the first digital data path based on the first clock phase associated with the first clock generator.

12. The method of claim 11, wherein the first clock phase is set based on a look-up table (LUT).

13. The method of claim 11, wherein the first clock phase is set to reduce cross-coupling of spurs between the first transmission chain and the second transmission chain.

14. The method of claim 11, wherein the first clock generator comprises a clock divider, and wherein setting the first clock phase includes setting a phase of an output clock signal of the clock divider with respect to an input clock signal of the clock divider.

15. The method of claim 14, wherein setting the phase of the output clock signal includes setting a reset phase of the clock divider.

16. The method of claim 11, further comprising:

setting a second clock phase associated with the second clock generator; and setting a second data phase associated with the second digital data path based on the second clock phase associated with the second clock generator.

17. The method of claim 16, wherein the first clock phase is different from the second clock phase.

18. The method of claim 11, wherein the first digital data path comprises a fractional delay filter configured to set the first data phase.

19. The method of claim 18, wherein the fractional delay filter comprises at least one digital gain element and wherein setting the first data phase comprises setting at least one gain value associated with the at least one digital gain element.

20. A wireless device, comprising:

at least one first antenna;

a first transmission chain coupled to the at least one first antenna and including a first clock generator and a first digital-to-analog converter (DAC), an output of the first clock generator being coupled to a clock input of the first DAC, wherein the first transmission chain further includes a first digital data path coupled to an input of the first DAC;

at least one second antenna;

a second transmission chain coupled to the at least one second antenna and including a second clock generator and a second DAC, an output of the second clock generator being coupled to a clock input of the second DAC, wherein the second transmission chain further includes a second digital data path coupled to an input of the second DAC; and a controller configured to set a data phase associated with the first digital data path based on a clock phase associated with the first clock generator.

* * * * *